United States Patent [19]
Thurnau et al.

[11] Patent Number: 5,844,430
[45] Date of Patent: Dec. 1, 1998

[54] CONTROLLABLE SIGNAL CONDITIONING CIRCUIT

[75] Inventors: Edwin M. Thurnau, Littleton, Colo.; Ernest A. Streicher, Columbus; Daniel D. Wilhelm, Nashville, both of Ind.

[73] Assignee: Cummins Engine Company, Inc., Columbus, Ind.

[21] Appl. No.: 653,081

[22] Filed: May 21, 1996

[51] Int. Cl.⁶ .......................... H03K 3/037; H03K 5/153
[52] U.S. Cl. .............................................. 327/74; 327/205
[58] Field of Search .................. 327/68, 74, 75, 327/76, 205, 206

[56] References Cited

U.S. PATENT DOCUMENTS

| | | | |
|---|---|---|---|
| 4,072,870 | 2/1978 | Davis | 307/350 |
| 4,169,232 | 9/1979 | Henrich | 307/354 |
| 4,399,414 | 8/1983 | Bird | 328/151 |
| 4,520,280 | 5/1985 | Yoshikawa et al. | 307/358 |
| 4,581,545 | 4/1986 | Beale et al. | 327/206 |
| 4,859,873 | 8/1989 | O'Shaughnessy et al. | 307/290 |
| 4,902,970 | 2/1990 | Suquet | 324/173 |
| 4,914,387 | 4/1990 | Santos | 324/166 |
| 4,933,869 | 6/1990 | Gareis et al. | 364/483 |
| 4,940,907 | 7/1990 | Lande | 307/359 |
| 5,015,878 | 5/1991 | Lasagna et al. | 307/358 |
| 5,015,879 | 5/1991 | Lasagna et al. | 307/358 |
| 5,097,147 | 3/1992 | Stuebing et al. | 307/354 |
| 5,107,135 | 4/1992 | Hagita | 307/261 |
| 5,155,386 | 10/1992 | Abdi | 307/355 |
| 5,274,326 | 12/1993 | Bleckmann et al. | 324/166 |
| 5,278,462 | 1/1994 | Wilson | 307/354 |
| 5,463,333 | 10/1995 | Calder et al. | 327/205 |
| 5,528,185 | 6/1996 | Lewicki et al. | 327/206 |

*Primary Examiner*—Toan Tran
*Attorney, Agent, or Firm*—Woodard, Emhardt, Naughton, Moriarty & McNett

[57] ABSTRACT

An apparatus and method for controlling a variable threshold signal conditioning circuit to condition a variable amplitude periodic input signal in response to the control signals received. A plurality of transistor circuits, each responsive to a control signal, are disposed in parallel with the positive feedback resistor of a trigger circuit. The transistor circuits are controlled to adjust the upper threshold levels of the trigger circuit in order to reduce the false triggering effects of noise in the input signal. The lower threshold level is held constant at the input signal mid-line voltage while the upper threshold level is varied over a plurality of preprogrammed values. A microprocessor determines the appropriate threshold level for the circuit by comparing the timing signal output of the signal conditioning circuit to preprogrammed values stored in the microprocessor memory.

22 Claims, 4 Drawing Sheets

CONTROLLABLE SIGNAL CONDITIONING CIRCUIT

FIELD OF THE INVENTION

The present invention relates to unidirection threshold detectors such as Schmitt triggers and more particularly to those triggers used to generate a digital timing pulse.

BACKGROUND OF THE INVENTION

A Schmitt trigger is a circuit that provides a digital output signal of either a logic HIGH or logic LOW in response to the level of a supplied input signal. When the input signal crosses a respective one of an upper and a lower threshold level in a specified direction, the output level changes from a corresponding first of the LOW/HIGH logic states to the second opposite state. The logic states of the digital output signal can be represented by a variety of preselected signal attributes such as, for example, a binary set of voltage levels or current levels.

The output of a Schmitt trigger typically remains at a logic LOW while the level of an input signal remains within a first range below an upper threshold level. When the input signal increases beyond the upper threshold level, the output switches to the logic HIGH state. The output remains HIGH as long as the input signal remains within a second range above a lower threshold level. When the input signal decreases below the lower threshold level, the output switches back to the logic LOW state. The range of input signals between the lower and upper thresholds is commonly referred to in the art as hysteresis.

It is generally known that a Schmitt trigger can be used to shape an alternating periodic signal into a logic signal. This is particularly the case when the alternating periodic signal consists of an output signal of a variable reluctance sensor associated with a toothed disk rotating synchronously with a driven shaft. This output signal has the appearance of a variable amplitude periodic signal with a frequency corresponding to the speed of rotation of the shaft.

It is well known in the art that the signal generated by a variable reluctance rotation sensor has an amplitude which varies greatly in relation to the frequency of rotation and in relation to the size of the air gap between the toothed disk and the magnetic pick-up. This variance is particularly noticeable when such sensors are used in internal combustion engine applications. For example, the operating range under normal conditions for an engine may vary from 30 rpm while cranking during starting conditions to over 6,000 rpm during high speed operation. The sensor must reliably provide information over this large rpm range. However, since the signal amplitude of many magnetic sensors is directly proportional to the rate of change of magnetic flux coupling the rotating member to the magnetic sensor, such sensors typically provide a signal having an amplitude that increases with engine rpm. Further, the noise component of the signal due to surface imperfections, vibration, non-concentric alignment, etc., also increases with the increase in signal amplitude. Thus, the high speed noise component may be greater than the low speed signal component, making it difficult to discriminate between the two. Moreover, the signal component may vary from a few tenths of a volt to tens of volts over the operating engine rpm range, complicating the discrimination effort further. Therefore, to provide a signal suitable for processing by other engine circuitry, the sensor output signal must be conditioned to provide an accurate indication of the rotational speed of the toothed disk over the full operating speed range thereof.

U.S. Pat. No. 4,169,232 to Henrich discloses a signal conditioning circuit for the output of a magnetic position sensor that discriminates between the noise component and the signal component by comparing the total signal to a variable threshold only after a positive going zero cross. The variable threshold is generated as a function of the peak amplitude of the total signal. Further, the signal conditioning circuit includes gain control means which varies the amplitude of the total output signal as a function of its peak to maintain the threshold above the noise component.

Other attempts to generate accurate output pulses in response to varying amplitude input signals with high noise levels associated therewith have sought to filter the noise component from the input signal prior to presentation to the triggering circuit. As with the Henrich circuit, these filter circuits are unduly complicated and more expensive than necessary, both in the number of required components and in the real estate consumed by the circuitry. Moreover, the reliability of electrical circuitry, in general, decreases with the increase in physical connections. Thus, a need arises for an inexpensive alternative for conditioning a variable amplitude periodic input to generate a digital timing pulse. Such an alternative should be simple in operation and should further minimize circuit complexity.

SUMMARY OF THE INVENTION

In accordance with one aspect of the present invention, a signal conditioning circuit having controllable preprogrammed threshold levels, said signal conditioning circuit comprising: means for generating a variable amplitude periodic input signal having a mid-line voltage; a microprocessor which generates at least one control signal; a threshold level circuit providing a plurality of preprogrammed threshold level signals, said threshold level circuit having an at least one input for receiving said at least one control signal; wherein said threshold level circuit is responsive to said at least one control signal to provide a threshold level signal corresponding to one of said plurality of preprogrammed threshold levels; and a trigger circuit exhibiting hysteresis between a lower threshold level and an upper threshold level, said trigger circuit having a first input receiving both said input signal and said threshold level signal simultaneously, and a second input receiving a reference voltage, said trigger circuit producing a logic LOW or a logic HIGH output in response to said input signal and said threshold level signal.

In accordance with a further aspect of the present invention, a signal conditioning circuit having controllable preprogrammed threshold levels, said signal conditioning circuit comprising: means for generating a variable amplitude periodic input signal having a mid-line voltage; a microprocessor having an input for receiving a digital logic timing signal and said microprocessor providing a control signal in response to a digital logic timing signal; a trigger circuit producing a digital logic timing signal in response to said variable amplitude periodic input, said trigger circuit exhibiting hysteresis between an upper threshold level and a lower threshold level, one of said threshold levels held constant at approximately said mid-line voltage of said variable amplitude periodic input signal and the other threshold level controlled through a plurality of predetermined threshold levels, said trigger circuit having a first input receiving said variable amplitude periodic input, a second input receiving said control signal, and a digital logic timing signal output provided to said digital logic input of said microprocessor; and wherein the controllable threshold level is controlled in response to said control signal received at said second input.

In accordance with yet another aspect of the present invention, a method of electronically controlling the trigger threshold levels of a variable threshold level signal conditioning circuit supplying a timing signal to an engine control module, comprising the steps of: (1) providing a variable amplitude periodic input signal to an input of the signal conditioning circuit; (2) providing a logic HIGH or a logic LOW output signal from the signal conditioning circuit to the engine control module corresponding to the frequency of the variable amplitude periodic input signal, the logic output signal determined by the relation of the input signal amplitude to the lower threshold level which is held constant at the input signal mid-line voltage, a variable upper threshold level, and the current logic state of the signal conditioning circuit output signal; and (3) commanding the upper threshold level to remain at or switch to any one of a plurality of preprogrammed upper threshold levels in response to the frequency of the output signal received by the engine control module compared to a plurality of predetermined frequency values stored in engine control module memory.

In accordance with yet a further aspect of the present invention, a controllable threshold trigger circuit for receiving an analog signal and providing a corresponding digital signal, comprising: means for generating a variable amplitude periodic input signal having a mid-line voltage; a comparator having an inverting input for receiving a reference voltage, a non-inverting input for receiving said input signal, and said comparator producing a digital logic output; a resistor positioned between said means for generating a variable amplitude periodic input signal and said non-inverting input; a feedback resistor connected between said non-inverting input and said digital logic output; wherein said comparator has positive feedback through said feedback resistor creating hysteresis in said comparator between an upper threshold level and a lower threshold level; a reference voltage connected to said inverting input; wherein said reference voltage is selected to maintain the lower threshold level at approximately the mid-line voltage of said input signal; a diode having an output and an input; a resistor having less resistance than said feedback resistor; a transistor having a base, a collector and an emitter; a control line; said transistor base connected to said control line, said transistor emitter connected to said digital logic output, said transistor collector connected to said output of said diode, said diode input connected to said resistor and said resistor connected to said non-inverting input of said comparator; and wherein a logic HIGH on said control line switches said transistor to the conduction mode establishing an alternative feedback path for said comparator thus raising the upper threshold level of said comparator.

One object of the present invention is to provide an improved signal conditioning circuit having controllable, preprogrammed trigger threshold levels to achieve accurate output pulses.

Another object of the present invention that one of the upper/lower threshold is held constant at the input signal mid-line voltage while the other of the upper/lower threshold level is controlled to reduce the effects of input signal noise on proper triggering of the circuit. In addition, variations in measured frequency are reduced, wherein the variations are a result of peak-to-peak variation in the base signal.

Yet another object of the present invention that the associated circuitry be inexpensive and simple.

A further object of the present invention that the signal conditioning circuit be operable with and controllable by a microprocessor. The microprocessor being programmable to vary the values at which the threshold levels are changed.

Still a further object of the present invention is that the signal conditioning circuit be operable with the circuitry of a motor vehicle to provide accurate timing signals to an engine control module.

These and other objects of the present invention will become more apparent from the following description of the preferred embodiment.

DESCRIPTION OF THE PREFERRED EMBODIMENT

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 1:
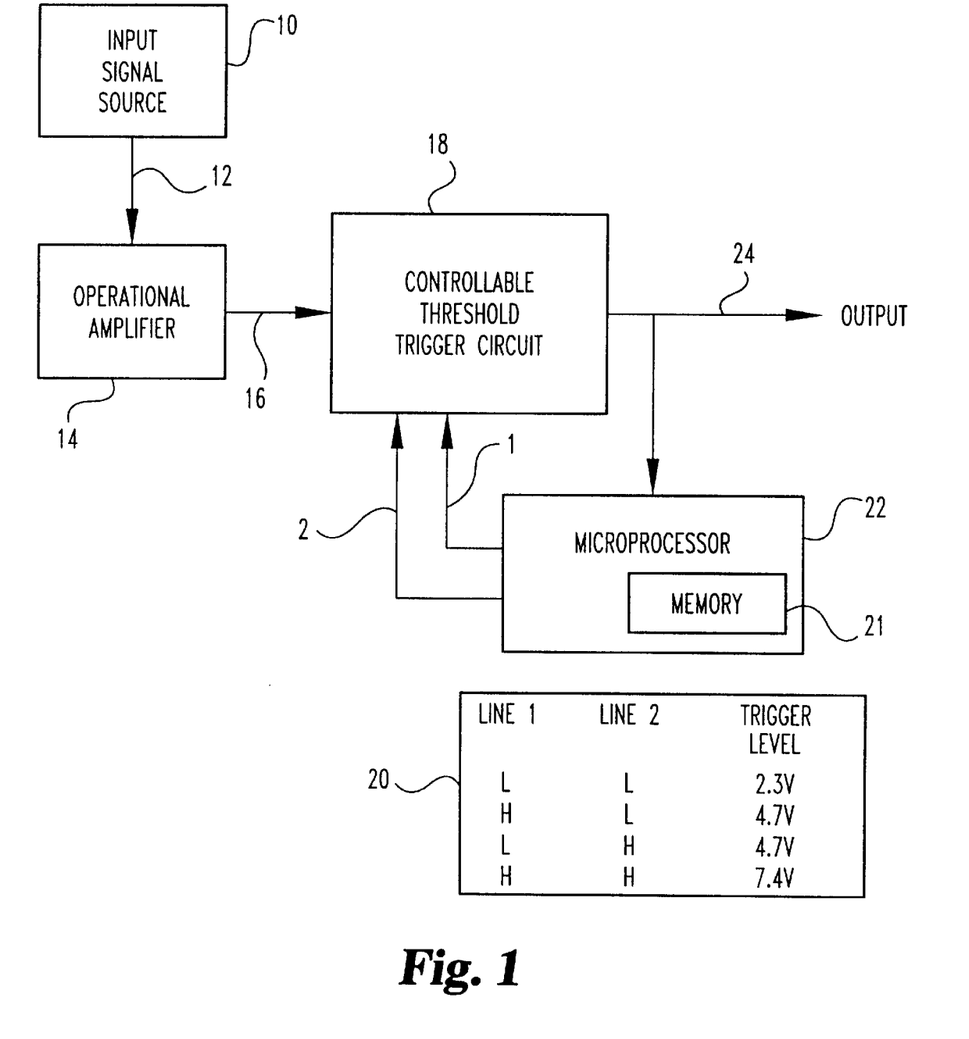
FIG. 1 is a block diagram of a signal conditioning circuit in accordance with the present invention.

Referring to FIG. 1, a block diagram of a signal conditioning circuit according to the present invention is shown. Input signal source 10 provides an input signal on signal line 12 which varies in amplitude over time creating a variable amplitude periodic input signal. The input signal on signal line 12 is provided to an input of operational amplifier 14. Operational amplifier 14 provides a desired amount of signal gain and also preferably shifts the mid-line (average) voltage of the input signal on signal line 12 upwardly. Preferably, the mid-line voltage of the input signal on signal line 12 is adjusted by amplifier 14 from a value of approximately zero volts to a mid-line value of approximately 2.0 volts. Those skilled in the art will recognize, however, that amplifier 14 can be made to shift the mid-line value of the input signal on signal line 12 to any desired value to suit a particular application.

The mid-line shifted signal is provided by amplifier 14 on signal line 16, which is connected to the input of controllable threshold trigger circuit 18. Circuit 18 generates a logic LOW or a logic HIGH output on signal line 24 in response to the amplitude of the mid-line shifted signal on signal line 16. Controllable threshold trigger circuit 18 has an upper threshold level and a lower threshold level, and exhibits hysteresis between these levels.

In a preferred embodiment of controllable threshold trigger circuit 18, the lower threshold level is fixed at approximately the mid-line voltage of the mid-line shifted input signal on signal path 16. However, the upper threshold level varies depending on the logic state of a control signal provided to circuit 18 by a microprocessor 22. Preferably, microprocessor 22 includes memory 21 to store desired information. Preferably, the value of the upper threshold level may change at any time during the cycle of the mid-line shifted signal on signal path 16 without causing a false triggering condition within circuit 18.

Preferably, and in the structure shown in FIG. 1, the control signal provided to circuit 18 by microprocessor 22 consists of a first control signal provided to circuit 18 via control line 1 and a second control signal provided to circuit 18 via control line 2, although it will be understood that the control signal could consist of any number of control signals provided to circuit 18 via any number of control lines depending on the number of upper threshold levels desired. In a preferred embodiment of circuit 18, a logic LOW on both control lines 1 and 2 sets the upper threshold level of circuit 18 at its lowest programmable threshold level. A logic HIGH on control line 1, while maintaining a logic LOW on control line 2, sets the upper threshold level of the trigger circuit 18 at a second higher predetermined threshold level. Similarly, a logic HIGH on control line 2, while maintaining a logic HIGH on control line 1, sets the upper threshold level of the trigger circuit at the same second higher predetermined threshold level. Finally, a logic HIGH on both control lines 1 and 2 sets the upper threshold level of trigger circuit 18 at its highest programmable threshold level. Block 20 of FIG. 1 shows the foregoing progression of controlled threshold levels of circuit 18 in response to the logic state of the control signals present on control lines 1 and 2. As illustrated in block 20, the signal conditioning circuit 12 preferably has preprogrammed upper threshold levels of within + or − 10% of 2.3 volts, 4.7 volts, and 7.4 volts.

In operation, controllable threshold trigger circuit 18 produces a digital logic output signal on signal line 24 based upon the amplitude of the input signal present on signal line 16 and received by the controllable threshold circuit 18, with respect to the selected upper and lower threshold levels and the previous state of the trigger circuit output. Preferably, the output waveform changes from a logic LOW of zero volts to a logic HIGH of five volts. This output waveform is provided to microprocessor 22 for subsequent determination of the frequency thereof, which frequency corresponds to the frequency of the input signal on signal line 16, as will be more fully discussed hereinafter.

It will be understood by those skilled in the art that there are a wide variety of sources which generate a variable amplitude periodic signal and any of these could provide the source of the input signal to be conditioned. Such an input signal could be generated by any source, although it is contemplated that the could preferably be generated by a machine and/or process that measures rotational speed of a shaft.

More specifically and without limitation on the application of the present invention, it is contemplated that input signal source 10 and corresponding input signal on signal line 12 represent an input signal generated by a variable reluctance sensor associated with a motor vehicle. Moreover, although the structure of FIG. 1 indicates it is desirable to use any microprocessor, in vehicle applications it is preferable that the microprocessor 22 forms part of a known engine control module or vehicle control computer. Further, the structure shown preferably includes the use of operational amplifier 14 to provide the aforementioned gain and input signal mid-line shift, although those skilled in the art will recognize that any alternate circuitry providing both gain and level shift comes within the spirit of the present invention. The upward shift in the input signal mid-line level allows the lower threshold level to be set at the mid-line voltage of the input signal and eliminates the need for a negative voltage source for the trigger circuit which results in a savings in circuitry costs.

In one preferred application of the signal conditioning circuit of FIG. 1, a variable reluctance sensor is attached to a camshaft of an internal combustion engine (not shown), and is operable to generate a variable amplitude quasi-sinusoidal signal with gaps therebetween corresponding to the engine speed, and provides this input signal on signal line 12. In another application, a variable reluctance sensor is attached to a vehicular transmission tail shaft (not shown), and is operable to generate a variable amplitude quasi-sinusoidal signal with gaps therebetween corresponding to vehicle speed, and provides this input signal on signal line 12. As will be more fully discussed hereinafter, microprocessor 22 is thereafter preferably operable to determine the corresponding engine and/or vehicle speeds from the falling edges of the output signal provided by circuit 18 on signal line 24. The sensed speeds may be thereafter used by the engine control module to control other engine parameters and/or vehicular functions.

Figure 2:
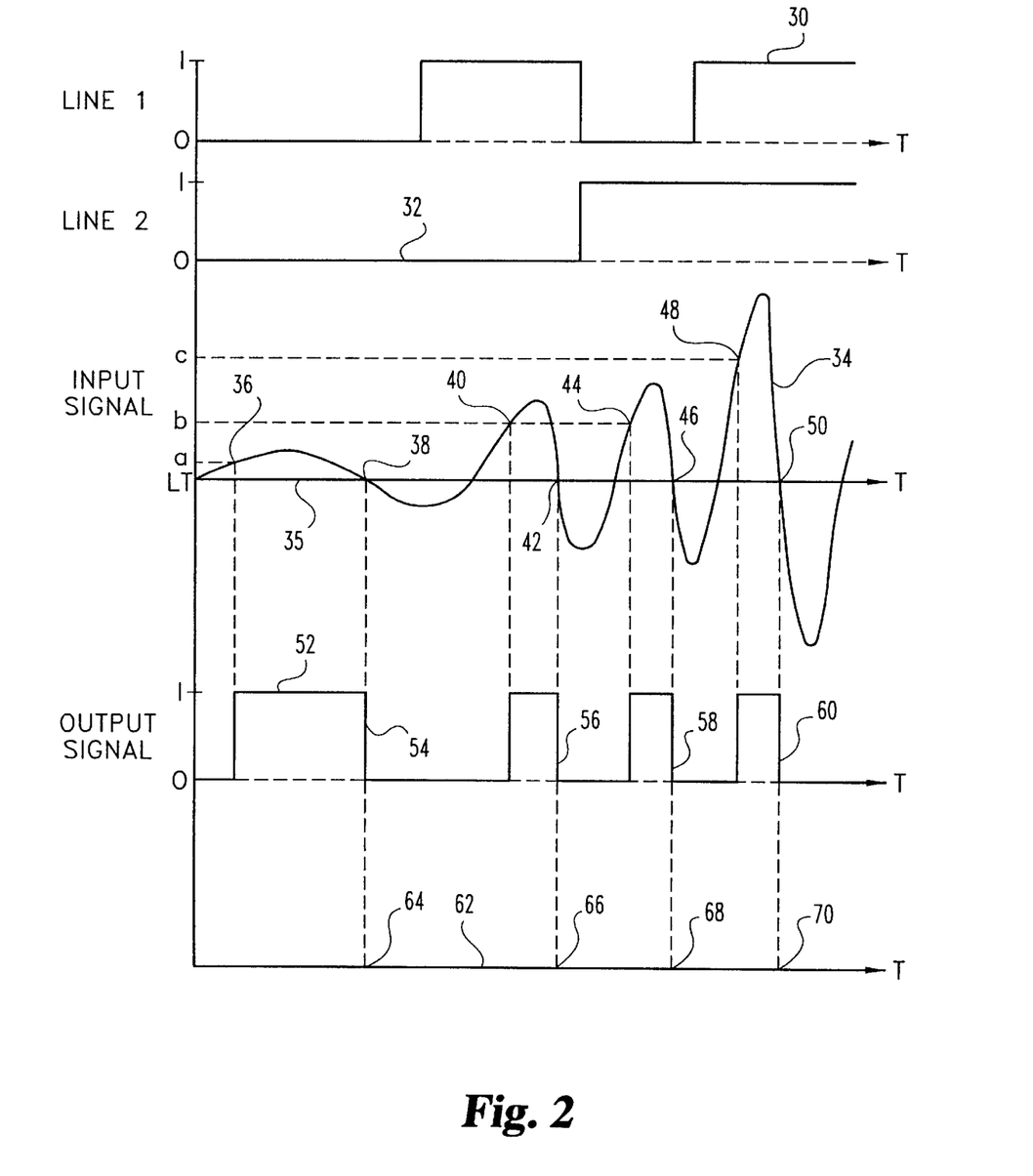
FIG. 2 is a timing diagram showing the control signals and input signal of the signal conditioning circuit of FIG. 1 and the corresponding output signal for the various operational modes thereof.

Referring now to FIG. 2, the various operational modes of the circuitry of FIG. 1, with respect to the control signals provided by microprocessor 22, will now be described in detail. In FIG. 2, a timing diagram of the input signal 34 on signal line 16, control signals 30 and 32 present on control lines 1 and 2, and the corresponding signal conditioning circuit 18 output signal 52 provided on signal line 24, is shown. Control signals 30 and 32 represent the logic signals present on control line 1 and control line 2 of FIG. 1 respectively. As previously discussed, the particular logic levels of the control signals 30 and 32 correspondingly determine the upper threshold level of trigger circuit 18 of FIG. 1. The upper threshold levels (a), (b), and (c) are shown in relation to input signal 34 provided on signal line 16, while the lower threshold level (LT) 35 is held constant, preferably at the mid-line voltage established by amplifier 14.

As shown in FIG. 2 beginning on the left side of the diagram, both control signals 30 and 32 are initially in their logic LOW states, thus controlling the upper threshold level of the trigger circuit to its lowest level (a) as described with respect to the chart 20 of FIG. 1. When input signal 34 exceeds upper threshold level (a) at point 36, the output signal 52 is switched from a logic LOW to a logic HIGH. When input signal 34 drops below the lower threshold level (LT) 35 at point 38, output signal 52 is switched from a logic HIGH to a logic LOW at falling edge 54 thereof. Regardless of the ultimate amplitude of input signal 34, output signal 52 will switch from a logic LOW to a logic HIGH whenever input signal 34 increases above upper threshold level (a), and will switch from a logic HIGH to a logic LOW whenever input signal 34 decreases below the fixed lower threshold level 35. Microprocessor 22 is preferably operable to sense the timing points 64 on timeline 62 at which the falling edges 54 of output signal 52 occur, and determine therefrom the frequency of the periodic input signal 34.

As the timing diagram progresses to the right, control signal 30 is switched to a logic HIGH, while control signal 32 remains at a logic LOW, thereby controlling the upper threshold level of the trigger circuit to the next higher upper threshold level (b). When input signal 34 exceeds upper threshold level (b) at point 40, trigger circuit output signal 52 is switched to a logic HIGH. Although the upper threshold level has changed from level (a) to level (b), the lower threshold level (LT) 35 is held constant at the mid-line voltage established by amplifier 14. Therefore, when the input signal 34 decreases below the lower threshold level 35 at point 42, the output signal 52 is switched to a logic LOW at falling edge 56 thereof. Again, regardless of the ultimate amplitude of input signal 34, output signal 52 will switch from a logic LOW to a logic HIGH whenever input signal 34 increases above upper threshold level (b), and will switch from a logic HIGH to a logic LOW whenever input signal 34 decreases below the fixed lower threshold level 35. Microprocessor 22 is again preferably operable to sense the timing points 66 on timeline 62 at which the falling edges 56 of output signal 52 occur, and determine therefrom the frequency of the periodic input signal 34.

Upper threshold level (b) continues to be the upper threshold level as long as either control signal 30 or 32 is in the logic HIGH state while the other control signal 32 or 30 respectively is in the logic LOW state. This is illustrated in the next cycle of input signal 34. With control signal 30 logic LOW and control signal 32 logic HIGH, input signal 34 crosses the upper threshold level (b) at point 44 thus causing the output signal 52 to switch to a logic HIGH. As previously described, as input signal 34 decreases below the lower threshold level (LT) 35, output 52 switches to a logic LOW at falling edge 58 thereof. As before, microprocessor is operable to sense the timing points 68 on timeline 62 at which the falling edges 58 of output signal 52 occur, and determine therefrom the frequency of the periodic input signal 34.

As the timing diagram continues to the right, control signals 30 and 32 are both at a logic HIGH state, thereby controlling the upper threshold level of the trigger circuit to the highest upper threshold level (c). When input signal 34 exceeds upper threshold level (c) at point 48, trigger circuit output signal 52 is switched from a logic LOW to a logic HIGH. Although the upper threshold level has changed from level (b) to level (c), the lower threshold level (LT) 35 continues to be held constant at the mid-line voltage established by amplifier 14. Therefore, when the input signal 34 decreases below the lower threshold level 35 at point 50, the output signal 52 is switched to a logic LOW at falling edge 60 thereof. As before, regardless of the ultimate amplitude of input signal 34, output signal 52 will switch from a logic LOW to a logic HIGH whenever input signal 34 increases above upper threshold level (c), and will switch from a logic HIGH to a logic LOW whenever input signal 34 decreases below the fixed lower threshold level 35. Microprocessor 22 is again preferably operable to sense the timing points 70 on timeline 62 at which the falling edges 60 of output signal 52 occur, and determine therefrom the frequency of the periodic input signal 34.

As the sinusoidal input signal 34 approaches the mid-line voltage of the input signal 34, the amplitude of the signal as well as the noise components approach the mid-line voltage. Since the lower threshold level 35 remains constant at the mid-line of the input signal 34, switching points 38, 42, 46 and 50 do not vary greatly as a result of input signal noise or the changing of upper threshold levels. Therefore, the falling edge of each output pulse provides a reliable timing reference.

The selection of the various threshold levels is dependent on the expected circuit environment and the desired level of conditioning circuit sensitivity. As previously described in the BACKGROUND section, the input signal noise increases as the amplitude of the input signal 34 increases. It is therefore desirable to vary at least one threshold level to a point above the expected noise level and thus greatly reduce the chance that a false triggering will occur as a result of input signal noise. Preferably, the disclosed circuitry holds the lower threshold level 35 constant at the mid-line voltage of the input signal 34 while varying the upper threshold levels to a level above the expected level of input signal noise. The lower threshold level 35 will provide accurate triggering if held constant at the mid-line crossing point. The mid-line crossing point of a sinusoidal signal makes a good threshold level since it is relatively unaffected by noise of the input signal as such noise also approaches zero at the mid-line crossing point. Therefore, a threshold level set at the mid-line will provide an accurate trigger output regardless of the input signal noise present. Although the configuration of holding the lower threshold level 35 constant and varying the upper threshold levels is shown, the present invention contemplates that the upper threshold level may be held constant at the input signal mid-line voltage while the lower threshold level is varied to limit the effects of input signal noise. Further, although the circuitry described hereinabove utilizes three programmable upper threshold levels, the present invention contemplates adding further upper threshold levels achieve a desired level of trigger circuit sensitivity.

Figure 3:
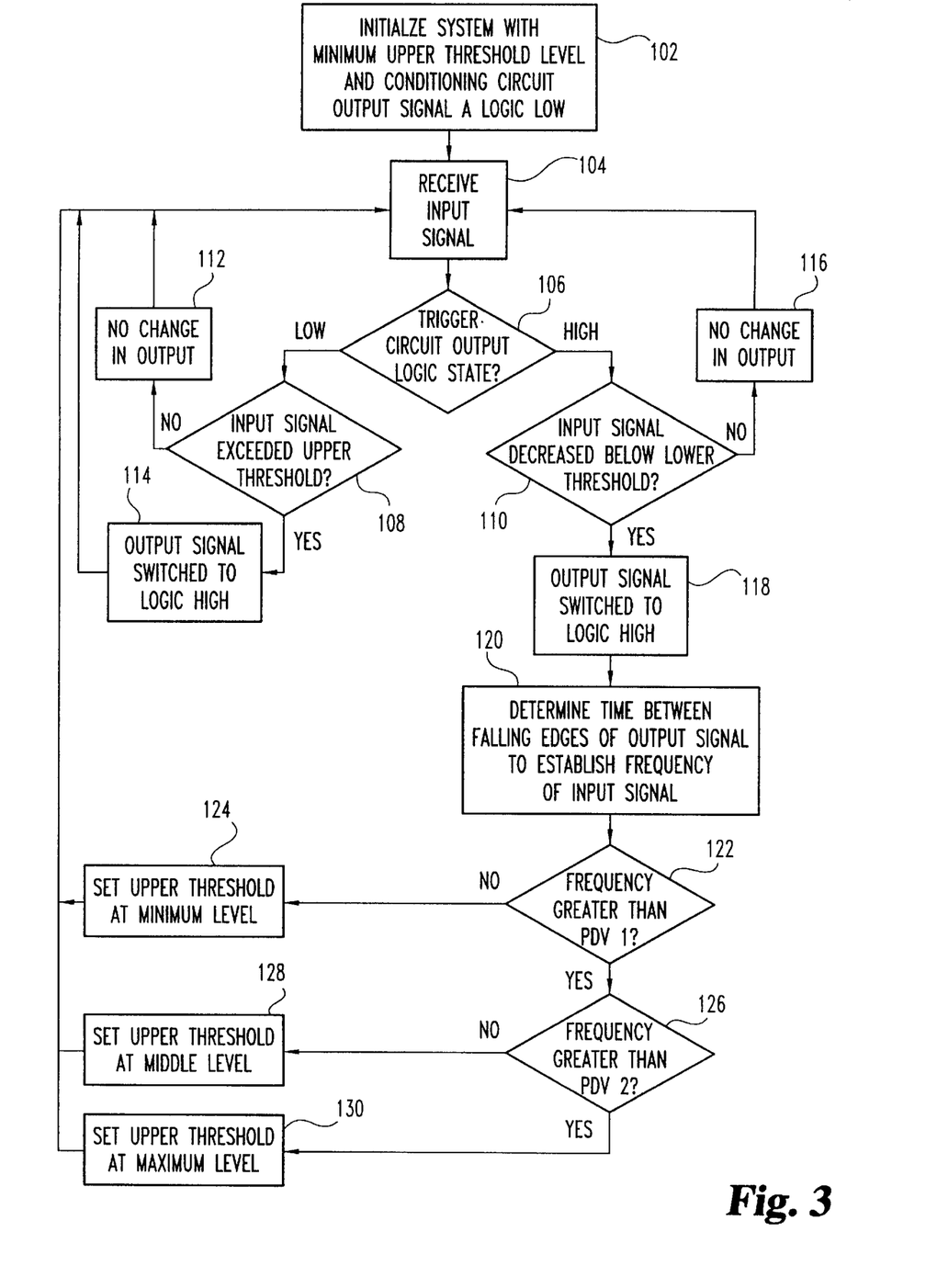
FIG. 3 is a flow chart illustrating one embodiment of a method of operation of the signal conditioning circuit of FIG. 1.

Referring now to FIG. 3, a flowchart illustrating one preferred method of operation of the signal conditioning circuit of FIG. 1 is shown. The circuit is initialized at step 102, setting the upper threshold level to the minimum level by controlling signals 30, 32 and 52 to their logic LOW states. The system next receives an input signal at step 104. Since the trigger circuit 18 exhibits hysteresis, the determination of the next transition of the trigger circuit output signal 52 is dependent on the current state of the output signal 52. Therefore, step 106 determines whether the previous output signal 52 of the trigger circuit 18 is a logic LOW or a logic HIGH. With the previous trigger circuit output signal 52 a logic LOW, the algorithm continues at step 108 by monitoring the input signal 34 to determine whether it has exceeded the upper threshold level (a). If the input signal 34 has not exceeded the upper threshold level, then as shown in step 112, there is no change in the conditioning circuit output signal and the algorithm returns to step 104 to monitor the input signal 34. However, if the input signal 34 has exceeded the upper threshold level (a) at step 108, the output signal 52 is switched to logic HIGH at step 114. After switching the output signal 52 to a logic HIGH, the algorithm returns to step 104 to monitor the input signal 34.

If the output signal 52 of the trigger circuit 18 was at a logic HIGH at step 106, the algorithm proceeds to step 110 to determine whether the input signal 34 has decreased below the lower threshold level 35. If the input signal 52 has not decreased below the lower threshold level 35 at step 110, there is no change in the output signal 52 at step 116 and the algorithm returns to step 104 to monitor the input signal 34. If, however, the input signal 34 has decreased below the lower threshold level 35 at step 110, the output signal 52 is switched to a logic LOW level at step 118.

The algorithm proceeds from step 118 to step 120 where microprocessor 22 determines the time between adjacent falling edges of output signal 52 and computes an instantaneous frequency of the input signal 34. Once the microprocessor has determined the frequency of the input signal at step 120, the upper threshold level of the circuit may be adjusted, if necessary, to move the upper threshold level to account for noise expected in the input signal 34. The determination of the appropriate threshold level is performed by comparing the frequency of the input signal 34 to a first predetermined value (PDV#1) at step 122. If the frequency of the input signal 34 is less than or equal to PDV#1 at step 122, then the upper threshold level remains at the minimum level at step 124 and the algorithm returns to step 104 to monitor the input signal 34. If, however, the frequency of the input signal 34 is greater than PDV#1 at step 122, the frequency of the input signal 34 is compared to a second greater predetermined value (PDV#2) at step 126. If the frequency of the input signal 34 is less than or equal to PDV#2 at step 126, the upper threshold level is controlled to the middle upper threshold level (b) at step 128, and the algorithm continues therefrom to step 104 to monitor the input signal 34. If, however, the frequency of the input signal 34 is greater than PDV#2 at step 126, the frequency of the upper threshold level is controlled to the maximum upper threshold level (c) at step 130, and the algorithm continues therefrom to step 104 to monitor the input signal 34.

It will be understood that as the frequency of the input signal 34 no longer exceeds the maximum upper threshold level (c) (PDV#2), the upper threshold level will be controlled to its middle upper threshold level (b). Likewise, when the frequency of the input signal 34 no longer exceeds the middle upper threshold level (b) (PDV#1), the upper threshold level will be controlled to the minimum upper threshold level (a).

The method of operating the circuitry of FIG. 1 as described with respect to FIG. 3 is preferably used with any machine and/or process that measures rotational speed of a shaft. Without limiting the application of the invention, one preferred use is in an internal combustion engine speed sensing operation. In the engine speed sensing operation, the system is initialized in the minimum upper threshold level (a) since the speed of the engine prior to cranking is approximately zero. The engine speed remains relatively low during the cranking phase, thus generating a low amplitude sensor signal which is provided to the conditioning circuit of FIG. 1. For this reason it is desirable to initialize the system with the minimum upper threshold level (a).

Moreover, microprocessor 22 of FIG. 1 is riot limited to only operating to perform the disclosed invention. The microprocessor could perform many other functions in addition to its operation in the invention. Preferably, one such function is that the microprocessor may have memory which stores the predetermined values for switching the threshold levels, although it is contemplated that these values could be stored in other memory means.

In one preferred application, microprocessor 22 is an engine control module and controls other engine parameters in response to the output of several signal conditioning circuits as well as generates the control signals 30 and 32 which adjust the upper threshold level of the triggering circuit 18. Preferably, the sensed engine speed is compared to predetermined engine speed values stored in microprocessor memory 21. Since the preprogrammed engine speeds reside in microprocessor memory, they can be easily modified for various engine applications while the hardware of the circuit remains unchanged. Further, if it is discovered that the setting of the upper threshold levels produces an unacceptable error level, the preprogrammed engine speed values could again be adjusted in memory, thus obviating the need to replace the hardware involved. Both of these advantages are realized because the threshold trigger levels are not directly dependent on the frequency or amplitude of the input signal 34, but are instead programmed into memory via software. The resulting circuits provide both a simpler circuit design and a greater level of adaptability due to the ability to program the upper threshold levels through software modifications rather than hardware changes.

Figure 4:
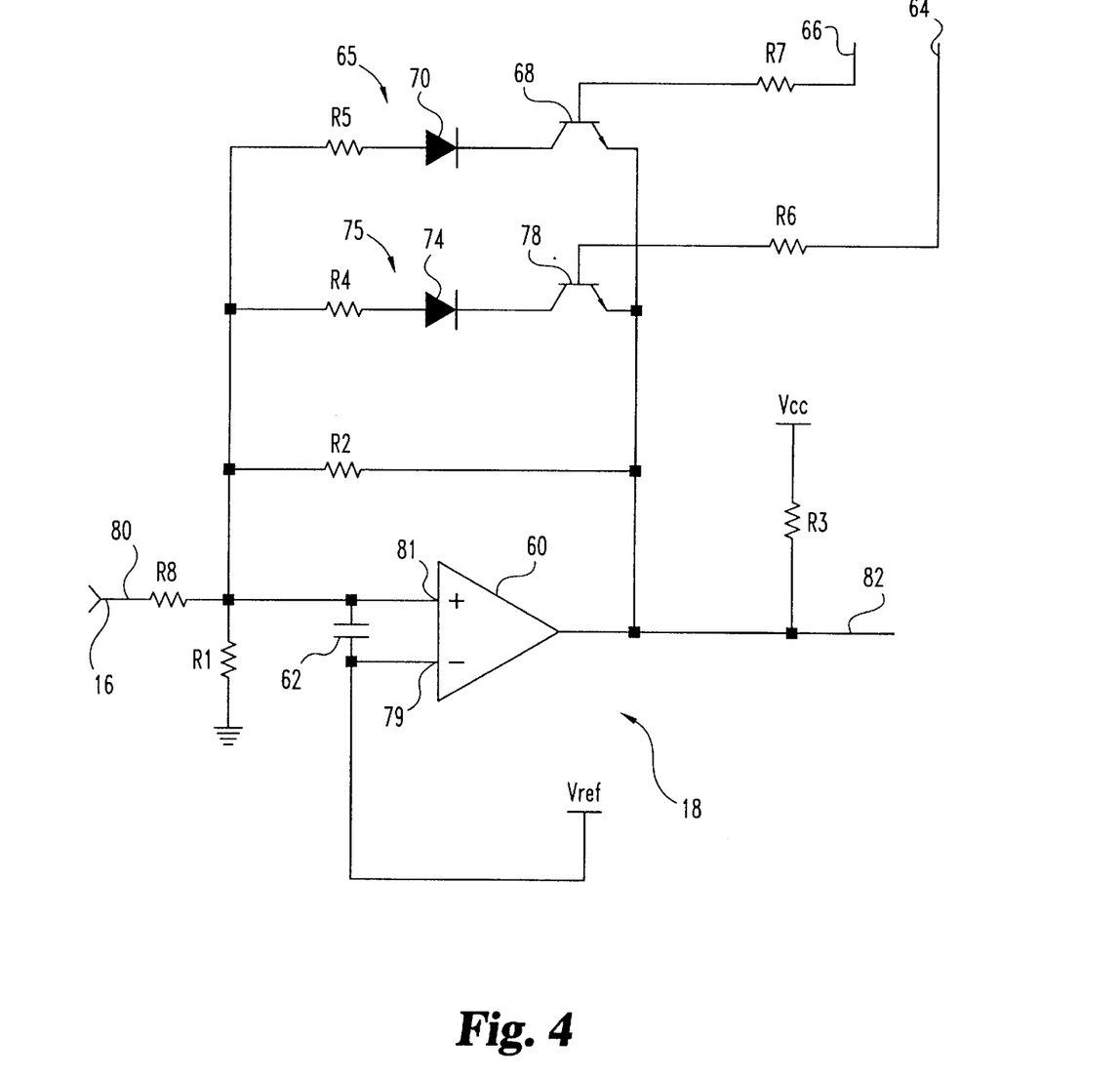
FIG. 4 is a schematic drawing of one embodiment of the controllable threshold trigger circuit of FIG. 1.

Referring now to FIG. 4, a schematic of a preferred embodiment of the controllable threshold trigger circuit represented as block 18 in FIG. 1 is shown. Central to the controllable threshold trigger circuit 18 is a comparator circuit 60 capacitively coupled between its inverting input 79 and non-inverting input 81 via capacitor 62. In one embodiment of circuit 18, capacitor 62 is approximately 22 pF. Capacitor 62 is included within circuit 18 as a filter to smooth out high frequency noise in the input signal 34 and reduce false trigger events. Inverting input 79 is connected to a constant reference voltage $V_{ref}$ which is preferably the mid-level voltage established by amplifier 14 of FIG. 1. Non-inverting input 81 receives input signal 34 from amplifier 14 through resistor R8. In one embodiment of circuit 18, R8 is approximately 2 kohms. Additionally, input signal line 80 is coupled to ground potential via resistor R1. In one embodiment of circuit 18, R1 is approximately 100 kohms. A resistor R2 is connected between an output 82 and non-inverting input 81 of comparator 60 to establish a positive feedback path therethrough as is known in the art to create a trigger circuit with hysteresis. In one embodiment of circuit 18, R2 is approximately 140 kohms. Further, as is known in the art, output 82 of comparator 60 is connected to a voltage source $V_{cc}$ through R3 to pull-up the voltage to the appropriate output logic level. The output 82 of comparator 60 corresponds to output signal path 24 of circuit 18 as shown in FIG. 1. In one embodiment, R3 is approximately 10 kohms.

Threshold level circuits 65 and 75 are connected in parallel with resistor R2 in the positive feedback path of comparator 60. Threshold level circuit 75 includes resistor R4, preferably approximately 5.6 kohms, connected in series with diode 74 which is connected to the collector of transistor 78. The base of transistor 78 is connected to control line 64 through resistor R6, preferably approximately 100 kohms. Similarly, threshold level circuit 65 includes resistor R5, preferably approximately 5.6 kohms, connected in series with diode 70 which is connected to the collector of transistor 68. The base of transistor 68 is connected to control line 66 through resistor R7, preferably approximately 100 kohms. Both control lines 66 and 68 provide either a logic HIGH or a logic LOW to the threshold level circuit 18 at the base of transistors 68 and 78 respectively.

Preferably, microprocessor 22 provides control signals 30 and 32 to circuit 18 on control lines 66 and 68. When transistors 68 and 78 each receive a logic LOW signal at their corresponding bases, both transistors 68 and 78 are in their "non-conducting" modes, thereby maintaining only R2 in the feedback path of comparator 60 to effectively maintain an upper threshold level of level (a); preferably 2.3 volts as previously discussed. When transistor 78 receives a logic HIGH signal at its base and transistor 68 receives a logic LOW signal at its base, transistor 78 is in the "conducting" mode and transistor 68 is in the "non-conducting" mode, thereby connecting R4 in parallel with R2 to effectively raise the upper threshold level for trigger circuit 60 to level (b); preferably from 4.7 volts as previously discussed. Likewise with transistor 68 receiving a logic HIGH signal at its base and transistor 78 receiving a logic LOW signal at its base, transistor 68 is in its "conducting" mode and transistor 78 is in its "non-conducting" mode, thereby connecting R5 in parallel with R2 to effectively raise the upper threshold level for trigger circuit 60 to level (b). When transistors 68 and 78 each receive a logic HIGH signal at their corresponding bases, both transistors are in their "conducting" mode, thereby connecting each of R4 and R5 in parallel with R2 to effectively raise the upper threshold level for trigger circuit 60 to level (c); preferably 7.4 volts as previously discussed.

In the structure shown, $V_{ref}$ is approximately 2.0 volts, thus the voltage applied at non-inverting input 81 must be greater than 2.0 volts. With both transistor 68 and 78 in the "non-conducting" mode, the input voltage need be only slightly greater than 2 volts because of the preferably large difference in resistor values between R8 (2 kohms) and R2 (140 kohms). With transistor 68 or 78 in the conducting mode, the resistance between comparator output 82 and input 81 is substantially reduced drawing a greater amount of current through the feedback circuit. The greater the current flowing through the feedback circuit specifically through resistors R5 or R4, the greater the voltage drop through the feedback circuit. The addition voltage drop through the feedback resistors requires the input voltage 80 to be substantially higher to exceed 2 volts at comparator input 81. Likewise, when both transistor 68 and 78 are in conducting mode, the reistance between the comparator output and input 81 is even less. Thus there is an additional increase in the input voltage 80 required to switch the comparator output.

When the comparator output 82 is in the logic HIGH state, diodes 70 and 74 prevent current flow in a reverse direction from the comparator output to the comparator input.

In a preferred embodiment, both threshold level circuits 65 and 75 have identical component values thus establishing the same threshold level when activated. However, it is contemplated that the component values of the threshold level circuits could be varied, thus creating different threshold levels when activated. Moreover, additional threshold level circuits can be added to respond to a greater number of control lines, thus adding the desired number of additional upper threshold levels.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A signal conditioning circuit having controllable preprogrammed threshold levels, said signal conditioning circuit comprising:

means for generating a variable amplitude periodic input signal having a mid-line voltage;

a microprocessor which generates at least one control signal;

a threshold level circuit having a plurality of preprogrammed threshold level signals, said threshold level circuit having an at least one input for receiving said at least one control signal;

wherein said threshold level circuit is responsive to said at least one control signal to provide a threshold level signal corresponding to one of said plurality of preprogrammed threshold levels; and a trigger circuit exhibiting hysteresis between a lower threshold level and an upper threshold level, said trigger circuit having a first input receiving both said input signal and said threshold level signal simultaneously, and a second input receiving a reference voltage, said trigger circuit producing a logic LOW or a logic HIGH output in response to said input signal and said threshold level signal.

2. The signal conditioning circuit of claim 1 wherein said reference voltage applied to said second input establishes the lower threshold level at approximately said input signal mid-line voltage and said threshold level circuit varies the upper threshold level between said preprogrammed threshold levels.

3. The signal conditioning circuit of claim 1 wherein said microprocessor further includes an input for receiving said trigger circuit logic output.

4. The signal conditioning circuit of claim 2 wherein said means for generating a variable amplitude periodic input signal comprises a variable reluctance sensor.

5. The signal conditioning circuit of claim 1 wherein said threshold level circuit further includes an input for receiving said trigger circuit logic output, wherein said threshold level circuit provides positive feedback for said trigger circuit.

6. The signal conditioning circuit of claim 4 wherein said variable reluctance sensor senses the engine speed of an internal combustion engine and wherein said microprocessor provides said control signal in response to a comparison of said trigger circuit logic output to a plurality of predetermined engine speed values.

7. The signal conditioning circuit of claim 4 wherein said variable reluctance sensor senses the speed of a transmission tail shaft and wherein said microprocessor provides said control signal in response to a comparison of said trigger circuit logic pulse output to a plurality of predetermined transmission tail shaft values.

8. A signal conditioning circuit having controllable preprogrammed threshold levels, said signal conditioning circuit comprising:

means for generating a variable amplitude periodic input signal having a mid-line voltage;

a microprocessor having an input for receiving a logic signal and said microprocessor providing a control signal in response to a logic signal;

a trigger circuit with controllable threshold levels producing a logic signal in response to said variable amplitude periodic input, said trigger circuit exhibiting hysteresis between an upper threshold level and a lower threshold level, one of said threshold levels held constant at approximately said mid-line voltage of said variable amplitude periodic input signal and the other threshold level controlled through a plurality of predetermined threshold levels, said trigger circuit having a first input receiving said variable amplitude periodic input, a second input receiving said control signal, a third input for receiving a reference voltage and a logic signal output provided to said logic input signal of said microprocessor; and wherein the threshold level controlled through a plurality of predetermined threshold levels is controlled in response to said control signal received at said second input.

9. The signal conditioning circuit of claim 8, wherein said lower trigger threshold level is held constant at the input signal mid-line voltage and said upper trigger threshold level is varied in response to said control signal.

10. The signal conditioning circuit of claim 9, further including a means for upwardly shifting the mid-line of said variable amplitude periodic input signal; wherein said variable amplitude periodic input signal mid-line voltage is upwardly shifted prior to being received by said trigger circuit first input; and wherein said lower threshold level is correspondingly upwardly shifted.

11. The signal conditioning circuit of claim 10, wherein the variable amplitude periodic input signal is upwardly shifted to approximately 2.0 volts making the lower threshold level upwardly shifted a corresponding 2.0 volts and wherein said predetermined upper threshold levels are 2.3 V, 4.7 V, and 7.4 V.

12. The signal conditioning circuit of claim 8 wherein said means for generating a variable amplitude periodic input signal comprises a variable reluctance sensor and wherein said variable reluctance sensor senses the engine speed of an internal combustion engine and wherein said microprocessor provides said control signal in response to a comparison of said trigger circuit logic output to a plurality of predetermined engine speed values.

13. The signal conditioning circuit of claim 8 wherein said means for generating a variable amplitude periodic input signal comprises a variable reluctance sensor and wherein said variable reluctance sensor senses the speed of a transmission tail shaft and wherein said microprocessor provides said control signal in response to a comparison of said trigger circuit logic pulse output to a plurality of predetermined transmission tail shaft values.

14. The signal conditioning circuit of claim 8, wherein said control signal is comprised of a plurality of digital signals.

15. A method of electronically controlling the trigger threshold levels of a variable threshold level signal conditioning circuit supplying a timing signal to a microprocessor, the method comprising the steps of:
   (1) providing a variable amplitude periodic input signal having a mid-line voltage to an input of the signal conditioning circuit;
   (2) providing a logic HIGH or a logic LOW output signal from the signal conditioning circuit input, or the logic output signal corresponding to the frequency of the variable amplitude periodic input signal, the logic output signal determined by the relation of the input signal amplitude to a lower threshold level of the signal conditioning circuit which is held constant at the input signal mid-line voltage, a variable upper threshold level, of the signal conditioning circuit, and a current logic state of the signal conditioning circuit output signal; and
   (3) commanding the upper threshold level to remain at or switch to any one of a plurality of preprogrammed upper threshold levels in response to the frequency of the logic output signal received by the microprocessor compared to a plurality of predetermined frequency values stored in microprocessor memory.

16. The method of claim 15 wherein the microprocessor comprises an engine control module.

17. The method of claim 16 wherein step (3) further includes the steps of:
   (3)(a) commanding the trigger threshold level to remain at or switch to a minimum threshold level in response to an output signal received by the engine control module below a first predetermined value;
   (3)(b) commanding the trigger threshold level to remain at or switch to a middle threshold level in response to an output signal received by the engine control module above said first predetermined value and below a second higher predetermined value; and
   (3)(c) commanding the trigger threshold level to remain at or switch to a maximum threshold level in response to an output signal received by the control module above said second predetermined value.

18. The method of claim 16 wherein the input signal of step (1) is generated by a sensor sensing the speed of an internal combustion engine.

19. The method of claim 16 wherein the input signal of step (1) is generated by a sensor sensing the speed of a transmission tail shaft.

20. The method of claim 16 wherein the engine control module of step (2) is programmable and wherein the method further includes the step of programming the programmable control module with the desired predetermined values prior to step (1).

21. A controllable threshold trigger circuit for receiving a variable amplitude periodic signal and providing a corresponding logic output, comprising:
   means for generating a variable amplitude periodic input signal having a mid-line voltage;
   a reference voltage approximately equivalent to said mid-line voltage;
   a comparator having an inverting input for receiving said reference voltage, a non-inverting input for receiving said input signal, and said comparator producing a digital logic output;
   an input resistor connected between said means for generating a variable amplitude periodic input signal and said non-inverting input;
   a feedback resistor connected between said non-inverting input and said digital logic output;
   wherein said comparator has positive feedback through said feedback resistor creating hysteresis in said comparator between an upper threshold level and a lower threshold level;
   wherein said reference voltage is selected to maintain the lower threshold level at approximately the mid-line voltage of said input signal;
   a diode having an output and an input;
   a first resistor having less resistance than said feedback resistor;
   a transistor having a base, a collector and an emitter;
   a control line;
   said transistor base connected to said control line, said transistor emitter connected to said logic output, said transistor collector connected to said diode output, said first resistor connected between said diode input and said non-inverting input of said comparator; and
   wherein a logic HIGH on said control line switches said transistor to the conduction mode establishing an alternative feedback path for said comparator thus raising the upper threshold level of said comparator.

22. The controllable threshold trigger circuit of claim 21 further including:
   a second diode having an output and an input;
   a second resistor;
   a second transistor having a base, a collector and an emitter;
   a second control line;
   said second transistor base connected to said second control line, said second transistor emitter connected to said digital logic output, said second transistor collector connected to said output of said second diode, said second diode input connected to said second resistor and said second resistor connected to said non-inverting input of said comparator;
   wherein a logic HIGH on said second control line switches said second transistor to the conduction mode and establishes a second alternative feedback path for said comparator thus raising the upper threshold level of said comparator.

* * * * *